(12) United States Patent
Bender

(10) Patent No.: US 7,635,414 B2
(45) Date of Patent: *Dec. 22, 2009

(54) SYSTEM FOR CONTINUOUS GROWING OF MONOCRYSTALLINE SILICON

(75) Inventor: David L. Bender, Thousand Oaks, CA (US)

(73) Assignee: Solaicx, Inc., Santa Clara, CA (US)

( * ) Notice: Subject to any disclaimer, the term of this patent is extended or adjusted under 35 U.S.C. 154(b) by 891 days.

This patent is subject to a terminal disclaimer.

(21) Appl. No.: 10/789,638

(22) Filed: Feb. 27, 2004

(65) Prior Publication Data

US 2005/0092236 A1     May 5, 2005

Related U.S. Application Data

(60) Provisional application No. 60/517,124, filed on Nov. 3, 2003.

(51) Int. Cl.
*C30B 21/06*     (2006.01)
*C30B 11/00*     (2006.01)
*C30B 28/08*     (2006.01)

(52) U.S. Cl. .................. 117/217; 117/200; 117/218; 117/222; 117/223

(58) Field of Classification Search .......... 117/200–224
See application file for complete search history.

(56) References Cited

U.S. PATENT DOCUMENTS

| | | | |
|---|---|---|---|
| 2,892,739 A | 6/1959 | Rusler | |
| 4,008,387 A * | 2/1977 | Green et al. | 117/202 |
| 4,036,595 A | 7/1977 | Lorenzini et al. | |
| 4,203,951 A | 5/1980 | Goriletsky et al. | |

(Continued)

FOREIGN PATENT DOCUMENTS

JP     62176981 A   *   8/1987

(Continued)

OTHER PUBLICATIONS

C . Wang et al.; A continuous Czochralski silicon crystal growth system; Journal of Crystal Growth 250 (2003), pp. 209-214.

(Continued)

*Primary Examiner*—Robert M Kunemund
*Assistant Examiner*—G. Nagesh Rao
(74) *Attorney, Agent, or Firm*—Michael Hetherington; Woodside Law Group

(57) ABSTRACT

An improved system based on the Czochralski process for continuous growth of a single crystal ingot comprises a low aspect ratio, large diameter, and substantially flat crucible, including an optional weir surrounding the crystal. The low aspect ratio crucible substantially eliminates convection currents and reduces oxygen content in a finished single crystal silicon ingot. A separate level controlled silicon pre-melting chamber provides a continuous source of molten silicon to the growth crucible advantageously eliminating the need for vertical travel and a crucible raising system during the crystal pulling process. A plurality of heaters beneath the crucible establish corresponding thermal zones across the melt. Thermal output of the heaters is individually controlled for providing an optimal thermal distribution across the melt and at the crystal/melt interface for improved crystal growth. Multiple crystal pulling chambers are provided for continuous processing and high throughput.

23 Claims, 9 Drawing Sheets

U.S. PATENT DOCUMENTS

| | | | |
|---|---|---|---|
| 4,265,859 A | 5/1981 | Jewett | |
| 4,282,184 A | 8/1981 | Fiegl et al. | |
| 4,289,571 A | 9/1981 | Jewett | |
| 4,330,362 A | 5/1982 | Zulehner | |
| 4,350,557 A * | 9/1982 | Scholl et al. | 117/15 |
| 4,350,560 A | 9/1982 | Helgeland et al. | |
| 4,396,824 A | 8/1983 | Fiegl et al. | |
| 4,410,494 A * | 10/1983 | Fiegl | 117/214 |
| 4,454,096 A * | 6/1984 | Lorenzini et al. | 117/213 |
| 4,592,895 A | 6/1986 | Matsutani et al. | |
| 4,659,421 A * | 4/1987 | Jewett | 117/21 |
| 4,957,712 A | 9/1990 | Shima et al. | |
| 5,085,728 A | 2/1992 | Mackintosh et al. | |
| 5,087,321 A | 2/1992 | Kamio et al. | |
| 5,087,429 A * | 2/1992 | Kamio et al. | 117/213 |
| 5,120,029 A * | 6/1992 | Durbin | 266/275 |
| 5,162,072 A * | 11/1992 | Azad | 117/202 |
| 5,180,562 A * | 1/1993 | Drechsel et al. | 117/213 |
| 5,242,531 A * | 9/1993 | Klingshirn et al. | 117/21 |
| 5,242,667 A | 9/1993 | Koziol et al. | |
| 5,288,366 A | 2/1994 | Holder | |
| 5,314,667 A * | 5/1994 | Lim et al. | 117/213 |
| 5,324,488 A * | 6/1994 | Klingshirn et al. | 117/213 |
| 5,360,480 A * | 11/1994 | Altekruger | 117/214 |
| 5,373,805 A | 12/1994 | Takano et al. | |
| 5,427,056 A * | 6/1995 | Imai et al. | 117/214 |
| 5,437,242 A * | 8/1995 | Hofstetter et al. | 117/14 |
| 5,492,078 A * | 2/1996 | Alterkruger et al. | 117/19 |
| 5,660,629 A | 8/1997 | Shiraishi et al. | |
| 5,700,321 A * | 12/1997 | Niikura | 117/19 |
| 5,733,368 A | 3/1998 | Nagai et al. | |
| 5,876,496 A | 3/1999 | Nagai et al. | |
| 5,900,055 A | 5/1999 | Nagai et al. | |
| 5,935,325 A | 8/1999 | Tsiji et al. | |
| 5,958,133 A | 9/1999 | Boulaev | |
| 5,976,247 A | 11/1999 | Hansen et al. | |
| 6,984,263 B2 * | 1/2006 | Wang et al. | 117/18 |
| 2004/0200408 A1 | 10/2004 | Wang et al. | |
| 2005/0092236 A1* | 5/2005 | Bender | 117/200 |

FOREIGN PATENT DOCUMENTS

| | | |
|---|---|---|
| JP | 5-310495 | 11/1993 |
| WO | WO 03/038161 A1 | 8/2003 |

OTHER PUBLICATIONS

T. Wangm; Shallow Melt Czohralski Growth of Semiconductor Silicon; NREL Golden, CO, May 8, 2003.

Hopkins et al.; Crystal Growth Considerations in the Use of "Solar Grade" Silicon; Journal of Crystal Growth 42 (1977) 493-498.

M.H. Leipold et al.;Materials of Construction for Silicon Crystal Growth; Journal of Crystal Growth 50 (1980) 366-377.

Tihu Wang, Shallow-Melt Czochralski Growth of Semiconductor Silicon,Electronic Mateials and Devices Division, NCPV, May 8, 2003.

* cited by examiner

Low Aspect Ratio Crucible

SYSTEM FOR CONTINUOUS GROWING OF MONOCRYSTALLINE SILICON

CROSS-REFERENCE TO RELATED APPLICATION

This patent application claims the benefit of U.S. provisional patent application Ser. No. 60/517,124, filed Nov. 3, 2003.

BACKGROUND

1. Field of the Invention

The field of the invention generally relates to growing silicon crystals by the Czochralski (CZ) technique. In particular, the field of the invention relates to a system and method for continuous and rapid growing of ultra pure, high minority carrier lifetime mono-crystalline silicon based on improvements to the Czochralski method.

2. Background of Related Art

Referring to FIGS. 1A and 1B, to be useful for the fabrication of semiconductor electronic components, silicon must be formed into a large (about 10-30 cm diameter), nearly perfect, single crystal, since grain boundaries and other crystalline defects degrade device performance. Sophisticated techniques are needed to obtain single crystals of such high quality. These crystals can be formed by either the Czochralski (CZ) technique or the float-zone (FZ) method.

Referring to FIGS. 1A and 1B, in a conventional CZ technique, pieces of polysilicon are first melted in a fused silica crucible 100 in an inert atmosphere (typically argon) within a growth chamber 102 and held at a temperature just above 1412 degrees C., the melting point of silicon. A high quality seed crystal 101 with the desired crystalline orientation is then lowered through pull chamber 106 into the melt 122 while being rotated. The crucible 100 is simultaneously rotated in the opposite direction to induce mixing in the melt and to minimize temperature non-uniformities. A portion of the seed crystal is dissolved in the molten silicon to remove strained outer portions and to expose fresh crystal surfaces.

The seed is then slowly raised or pulled from the melt 122 by a crystal pulling mechanism 108. As the seed is raised, it cools and material from the melt adheres to it, thereby forming a larger crystal or ingot 103. Under the carefully controlled conditions maintained during growth, the new silicon atoms continue the crystal structure of the already solidified material. The desired crystal diameter is obtained by controlling the pull rate and temperature with conventional feedback mechanisms. In this manner, cylindrical, single crystal ingots of silicon are fabricated.

A problem in a conventional CZ process arises when a high temperature charge of molten silicon 122 is heated within a typical narrow diameter, high width, high aspect ratio crucible 100 by means of heater elements disposed around the vertical walls of the crucible. Driving heat though the crucible walls to heat the charge creates stress on the crucible and shortens its useful life. After each growth cycle, the molten silicon remaining in the bottom of the crucible solidifies and expands to such an extent that it can break the crucible. Thus, in a conventional CZ process the crucible is generally a single use item.

The silicon must be continuously heated to remain molten in the crucible. Thus, referring to FIG. 1B, in a conventional high aspect ratio, narrow diameter CZ crucible 100 with heaters 118 disposed around the vertical walls of the crucible, the temperature distribution though the melt is characterized by a high thermal gradient and large temperature difference between the hot walls of the crucible and the coolest spot at the center of the crystal in the solidification zone at the melt/crystal interface as shown at 109. Consequently there is a significant radial temperature gradient and convection velocity gradient across the solidification zone at the melt/crystal interface and the region adjacent to the walls are driven to an undesirably high temperature with attendant excess convection current velocity and thermal perturbations. This condition is sub-optimal for maximized pull rate of high quality defect free crystal. In order to grow more, high quality silicon at a faster rate, a different crucible and heater design is needed that provides a uniform temperature distribution with minimized thermal gradient and convection velocity gradient in the solidification zone at the crystal/melt interface 107.

Conventional CZ grown silicon differs from ideal monocrystalline silicon because it includes imperfections or defects that are undesirable in fabricating integrated circuit devices or high conversion efficiency solar cells. Defects in single crystal silicon form in the crystal growth chamber as the crystal cools after solidification. Defects generally are classified as point defects or agglomerates (three-dimensional defects). Point defects are of two general types: vacancy point defects and interstitial point defects.

In a vacancy point defect, a silicon atom is missing from one of its normal positions in the silicon crystal lattice. This vacancy gives rise to the point defect.

An interstitial point defect occurs when an atom is found at a non-lattice site (interstitial site) in the silicon crystal. If the concentration of such point defects reaches a level of critical saturation within the single crystal silicon, and if the mobility of the point defects is sufficiently high, a reaction, or an agglomeration event, may occur.

In a conventional CZ process, point defects are generally formed at the interface between the silicon melt and the solid silicon. Such defects arise, in part, due to thermal perturbations around the crystal resulting from convection currents and the inability to closely control and or maintain an optimal temperature distribution particularly in the solidification zone at the crystal/melt interface.

Therefore, what is also needed is an improved heating system with multiple separate heating zones to aid in controlling crystal formation rates and defect density. Also, such a configuration should substantially eliminate convection currents and thermal perturbations that lead to the formation of point defects. It also would be desirable to minimize the radiant energy that strikes the crystal during growth, allowing for more rapid cooling of the crystal and higher pull rates. In a conventional CZ process the hottest surface is that part of the crucible wall not submerged in the melt. A high aspect ratio crucible brings this surface in close proximity to the cooling ingot, inhibiting optimal cooling of the ingot largely through heating by radiation.

Another problem with conventional CZ grown silicon is that it contains a substantial quantity of oxygen. This is due to the composition and configuration of the typical high-aspect ratio, narrow diameter crucible, wherein convection currents scrub the walls of the crucible and convey impurities into the melt and ultimately to the crystal itself. The convection currents add oxygen to the melt resulting from the slow dissolution of fused silica (silicon dioxide) on the walls of the crucible holding the molten silicon. This introduction of oxygen into the melt can cause defects in the finished crystal.

In photovoltaic and other applications, high oxygen content in the silicon adversely affects minority carrier lifetime and greatly degrades performance and in photovoltaic devices reduces the conversion efficiency.

Thus, what is needed is a crucible design that can minimize the introduction of oxygen into the melt and provide substantially oxygen free silicon characterized by high minority carrier lifetime for photovoltaic and other applications. The use of a special coating or material for a crucible that would make the crucible resistant to breakdown by molten silicon currently is not feasible since the crucible is a single use item and is broken by solidification of unused silicon during the cool down period after each use.

Therefore, what is also needed is a new crucible design that enables useful crucible lifetime to be extended over many cycles of operation without damage, and thus would make a potentially higher cost inert crucible surface economically feasible. Additional problems with a conventional CZ process are the inability to control dopant concentrations across the melt and across the resulting crystal. For many integrated circuit processes a desired dopant density is added to the silicon. Such dopant concentration is obtained by incorporating a small carefully controlled quantity of the desired dopant element, such as boron or phosphorus into the melt. For accurate control, a small quantity of heavily doped silicon is usually added to the undoped melt. The dopant concentration in the pulled crystal of silicon is always less than that in the melt because dopant is rejected from the crystal into the melt as the silicon solidifies. This segregation causes the dopant concentration in the melt to increase undesirably as the crystal grows. The seed end of the crystal therefore is less heavily doped than the tail end.

The segregation effect is also a function of conditions including temperature. Thus, a non-uniform temperature distribution through the solidification zone, crystal/melt interface provides an undesirable dopant concentration gradient and attendant resistivity gradient along the crystal radius. Accordingly, what is also needed is a simplified crucible design that minimizes segregation and enables dopant concentration and resistivity to be substantially uniform throughout the crystal.

SUMMARY OF THE INVENTION

In order to overcome the foregoing disadvantages of conventional CZ processing systems, an aspect of the invention provides a system for continuous crystal growth comprising a low aspect ratio, large diameter, and substantially flat crucible, including an optional weir surrounding the crystal. The large diameter, low aspect ratio crucible substantially eliminates convection currents and reduces oxygen content in a finished single crystal silicon ingot. Multiple crystal pulling chambers are disposed with respect to the crucible, such that upon completion of crystal growth, a first pulling chamber moves a finished silicon ingot out of the growing zone for cooling, and a successive pulling chamber moves to position a new crystal in the growing zone, thereby eliminating down time associated with cooling the crystal and providing continuous crystal growth with high throughput.

A separate level controlled silicon pre-melting chamber provides a continuous source of molten silicon to the growth crucible. This advantageously eliminates the need for a crucible raising system and vertical travel of the growth crucible during the crystal pulling process, thus greatly simplifying the CZ crystal growing system. It will be appreciated that eliminating the need for vertical travel of the crucible and the crucible raising system enables controllable heater elements to be disposed across the base of the growth crucible in addition to heater elements disposed around the vertical walls.

The low aspect ratio crucible with annular heater elements disposed on the base advantageously provides a thermal distribution characterized by a low thermal gradient and small temperature difference between the walls of the crucible and the coolest spot at the center of the crystal in the solidification zone at the melt/crystal interface. Consequently the radial temperature gradient and convection velocity gradient across the solidification zone at the melt/crystal interface is significantly reduced providing uniform and optimal conditions throughout the solidification zone at the melt/crystal interface. Further, the region adjacent to the walls is no longer driven to an excess temperature. Thus, convection currents and thermal perturbations that are a chief cause of point defects are minimized again, contributing to uniform and optimal conditions.

Minimized convection currents further reduce the quantity of oxygen introduced into the melt from scrubbing of the quartz crucible walls, enabling growth of crystals having fewer defects and lower oxygen content than is possible with a conventional CZ system. The continuous flow of molten silicon from the separate pre melting chamber coupled with the addition of dopant as needed during ingot growth permits compensation for segregation and establishes a substantially uniform dopant concentration axially (longitudinally) and radially in the grown crystal.

The advantages of oxygen reduction achieved in the finished crystal, coupled with reduction in other impurities and reduction in dislocations in the crystal lattice, are especially useful for providing enhanced minority carrier lifetime for improved, high conversion efficiency photovoltaic devices.

The low aspect ratio crucible increases the distance between the hot crucible wall not submerged in the melt and the cooling ingot, reducing heating by radiation and allowing optimal cooling of the ingot.

Multiple crystal pulling chambers are rotatably or otherwise sequentially disposed with respect to the crucible, such that upon completion of a first single crystal silicon ingot, the first pulling chamber moves the finished silicon ingot out of the growing zone for cooling, and a successive pulling chamber moves to position a new crystal in the growing zone. The sequential positioning of pulling chambers at the growing zone completes the continuous process, eliminates down time associated with cooling each crystal and changing to a new crucible, and thus provides a system for continuous crystal growth with high throughput. Since in a continuous process the crucible and melt are not cooling and reheating to melt temperature, considerable energy savings result. Also, the atmosphere around the heaters and crucible are not opened to ambient atmosphere, thus fewer impurities and contaminants are introduced into the crystal pulling chamber.

Impurities introduced into the melt, e.g. from scrubbing action of convection currents within the crucible, are dependant upon the average dwell time of silicon in the crucible and the surface area of contact between the melt and the crucible, especially the surface area of the vertical walls of the crucible. In an aspect of the invention, the dwell time is minimized through the improved cycle time and the average area of contact is minimized through the optimized low aspect ratio crucible design. It will be appreciated that these same considerations will apply to the pre-melter whose sizing and therefore dwell time and surface area of melt contact are optimized.

Another aspect of the invention provides enhanced temperature control that maintains a temperature in the melt of approximately 1420° C., such that the temperature has an optimized thermal distribution between the melt and crystal for accelerated crystal growth. To achieve such an optimized thermal distribution at the critical interface between the crystal and the melt, a plurality of annular, independently monitored heating elements are disposed in a radial pattern across the base of the growth crucible, as close to walls and to the bottom of the growth crucible as possible. The heating elements are separately controlled with active feedback to enable rapid thermal response and distribute the thermal workload to achieve an optimized thermal distribution across the interface between the crystal and the melt and between the crystal and walls of the crucible. This also contributes to improved crucible life, as well as reduction of oxygen and other impurities, in the finished single crystal silicon.

In contrast to a conventional CZ system, the growth crucible is no longer a single use item, but rather can be reused over multiple crystal growing cycles. Accordingly, growth crucible surfaces in contact with molten silicon are provided with a coating of alpha or beta silicon carbide, or similar ceramic coating that is inert with respect to molten silicon and further safeguards against introduction of oxygen into the melt. It will be appreciated that for similar reasons the pre-melter can be fabricated from these advantageous materials.

The foregoing aspects of the invention advantageously prevent the introduction of oxygen into the melt and provide a crucible that is capable of being used for about 10 crystal growing runs or more, while achieving a single crystal silicon product of substantially float zone quality with enhanced minority carrier lifetime. The oxygen reduction achieved in the finished silicon crystal is especially useful for providing enhanced minority carrier lifetime for applications such as improved conversion efficiency photovoltaic devices.

BRIEF DESCRIPTION OF THE DRAWINGS

The drawings are heuristic for clarity. The foregoing and other features, aspects and advantages of the invention will become better understood with regard to the following descriptions, appended claims and accompanying drawings in which:

DETAILED DESCRIPTION

Figure 1A:
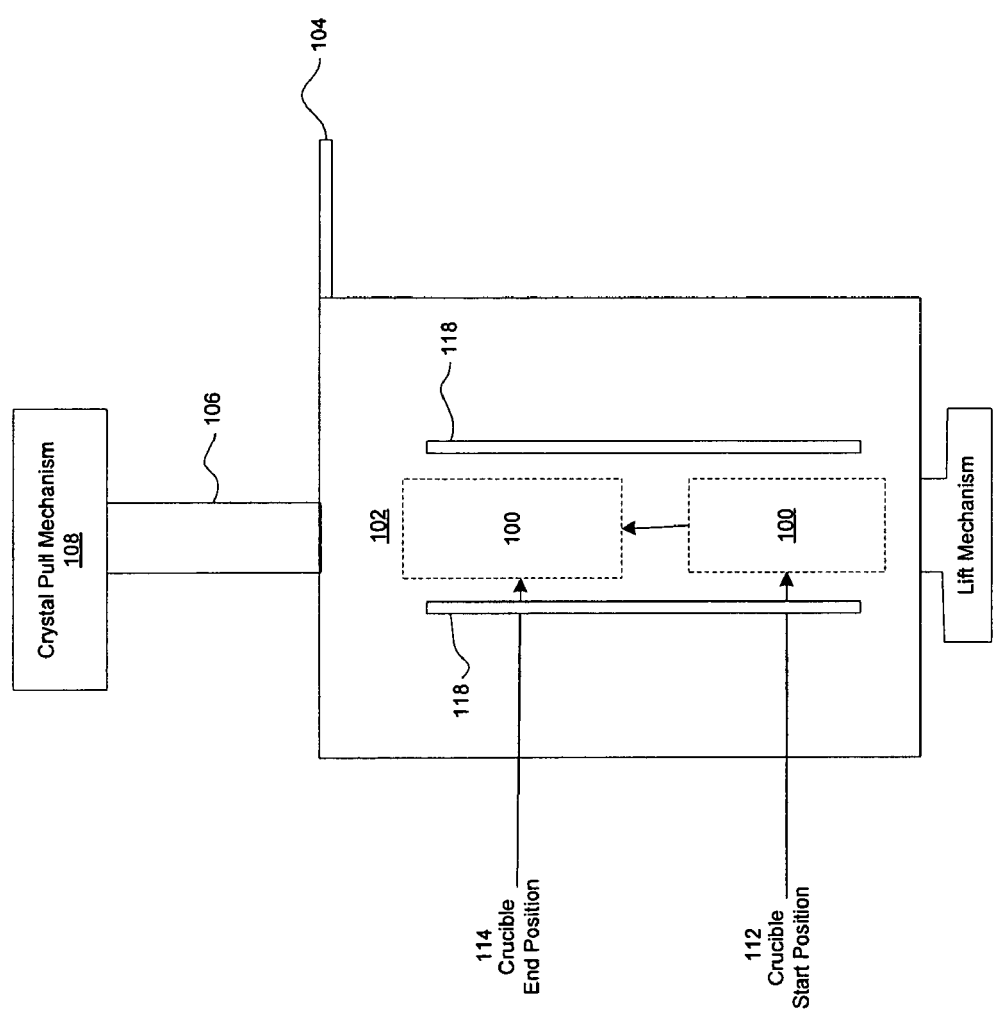
FIG. 1A is a schematic side view of a conventional CZ system.
Figure 1B:
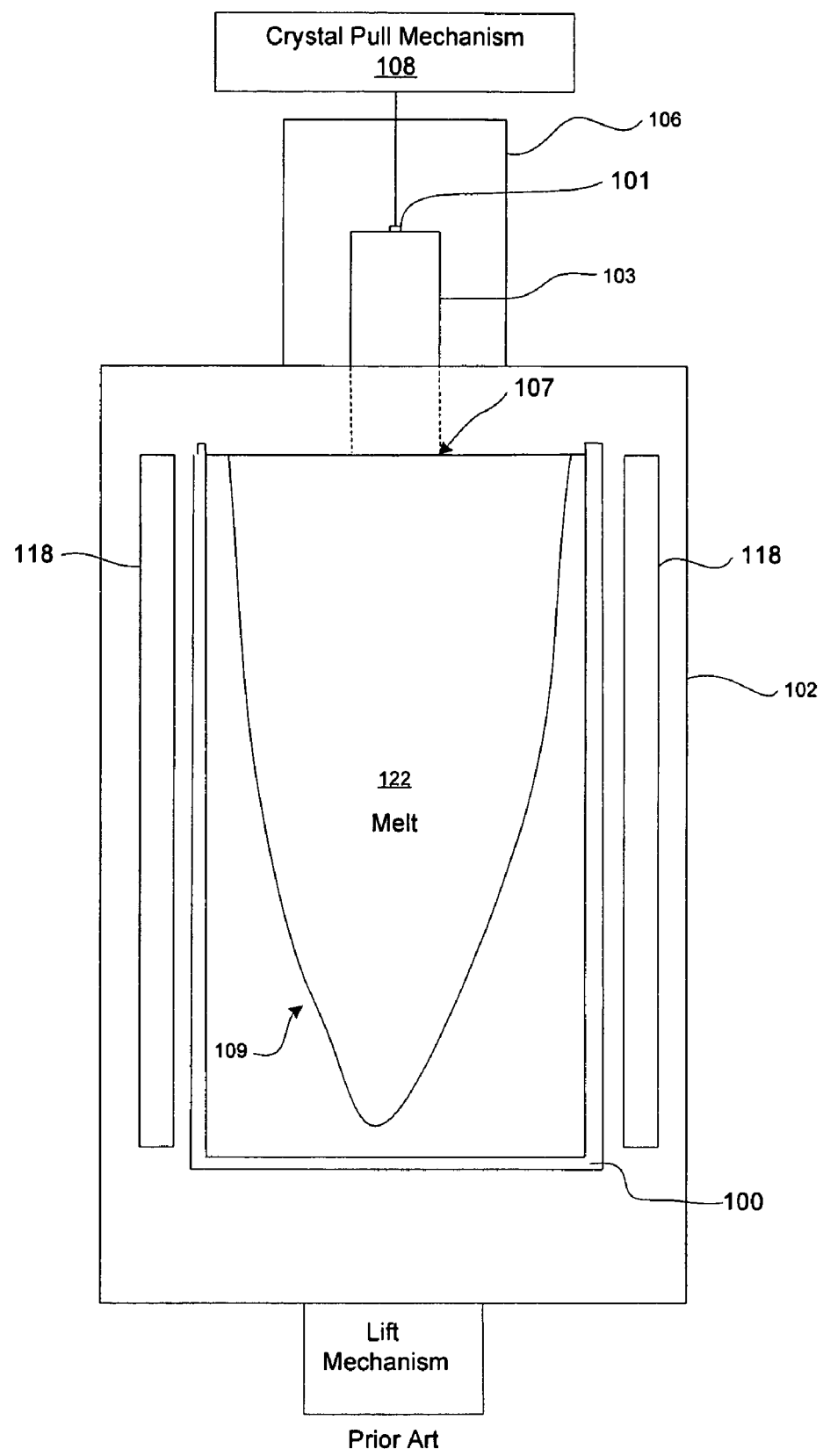
FIG. 1B is a schematic side view of a conventional CZ system showing the undesirable temperature gradient through the melt.

Referring to FIGS. 1A and 1B, in a conventional CZ system pieces of polysilicon are melted in a fused silica crucible 100 in an inert atmosphere in growth chamber 102. The atmosphere in the chamber 102 is typically argon and is controlled by isolation valve 104 in accordance with techniques that are well known. The silicon is held in crucible 100 at a temperature just above 1412 degrees C, the melting point of silicon. A high quality seed crystal with the desired crystalline orientation is lowered in the crystal pull chamber 106 to contact the melt at crystal melt interface 107 in the crucible 100 while being rotated. Crucible 100 is simultaneously rotated in the opposite direction to induce mixing in the melt and to attempt to minimize temperature non-uniformities. A portion of the seed crystal is dissolved in the molten silicon to remove strained outer portions and to expose fresh crystal surfaces.

The seed is then slowly raised or pulled from the melt in crystal pull chamber 106 by conventional pull mechanism 108. As the seed is raised, it cools and material from the melt adheres to it, thereby forming a larger crystal or ingot 103. The main body of the crystal or ingot 103 is grown by controlling the pull rate and the melt temperature while compensating for the decreasing melt level in the crucible. That is, as the crystal grows, the molten silicon in the crucible 100 is depleted. In order to compensate for the changing level of melt in the crucible 100 with respect to the heaters disposed around the vertical walls of the crucible, the crucible 100 must be elevated vertically in carefully controlled fashion from a starting crystal growth position 112 to a final or end position 114.

Complex mechanisms must be provided to coordinate the vertical travel of the crucible with the pulling of the crystal. The vertical travel of the crucible must be precisely coordinated with the pulling of the crystal in a vertical direction, such that a constant interface between the crystal and the melt is carefully maintained and the interface between the crystal and the melt is positioned correctly with respect to the heaters.

The diameter of the crystal is controlled by decreasing or increasing its pull rate and/or the melt temperature until the desired or target diameter is reached. The initial pull rate is generally relatively rapid. The pulling continues until the melt is nearly exhausted. It is very expensive to design equipment that provides precise coordinated vertical travel of the crucible with the crystal pulling mechanism.

FIGS. 1A and 1B show additional disadvantages associated with a conventional CZ crucible and heater arrangement. A conventional CZ crucible 100 is characterized by a narrow diameter, high aspect ratio. The high aspect ratio is necessary in order to hold all of the molten silicon for the growing crystal as there is typically no means for replenishment of the melt. Instead, the crucible 100 must travel in a vertical direction (from start position 112 to end position 114) in coordination with the pulling of the crystal as silicon in the crucible is depleted.

Heater elements 118 are provided around the circumference of the crucible 100 and produce a temperature distribution in the melt which disadvantageously maximizes the thermal gradient ($\Delta T$) between the heater, the walls of the crucible, the melt and the crystal suspended in the center of the melt and can cause the walls of the crucible to be taken to excess temperatures. This disadvantageously slows crystal growth.

In addition, convection currents are generated in the narrow diameter, high aspect ratio crucible 100. Convection currents adversely affect the purity of the single crystal silicon. A conventional CZ crucible 100 is comprised of a material such a fused silica. Molten silicon breaks down the walls of a conventional fused silica crucible into silicon and oxygen. Convection currents scrub the walls of the crucible and convey oxygen and other impurities into the melt. This adversely affects the purity and defect structures in the growing crystal. Convection currents also create adverse thermal perturbations around the growing crystal that may induce defects into the crystal.

Upon completion of crystal growth, residual molten silicon that is not removed from the crucible 100 greatly expands upon solidification and breaks the crucible. The typical CZ crucible 100 is therefore a single use disposable item that is discarded after each silicon ingot is grown.

Wide Diameter, Low-Aspect Ratio Crucible

Figure 2:
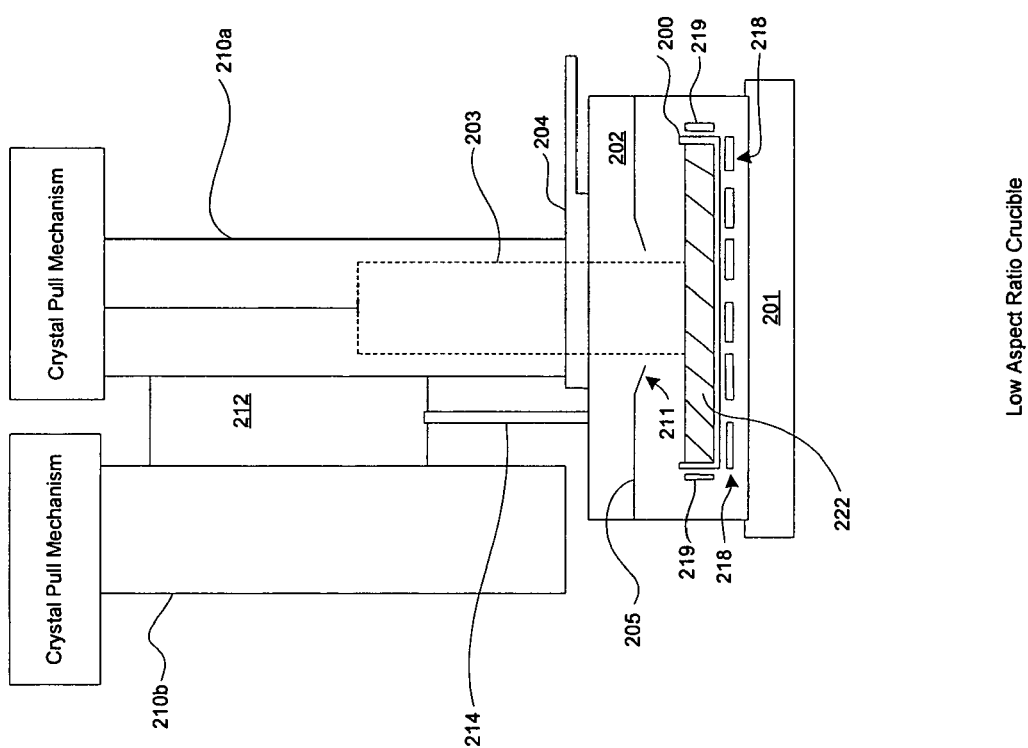
FIG. 2 is a schematic side view of a system for growing enhanced purity single silicon crystal in accordance with an aspect of the present invention.

Referring to FIG. 2, a crystal growing system according to an aspect of the present invention provides a fixed, wide diameter, low-aspect ratio crucible 200 provided in growth chamber 202, which is in turn provided with a base 201. A conventional isolation valve 204 provides a vacuum or otherwise controls the atmosphere in growth chamber 202 and multiple crystal pull chambers 210a and 210b in a well-known manner. The wide diameter, low aspect ratio configuration of the crucible 200 is provided with a means for minimizing radiant heat, such as a heat shield 205, for minimizing radiant energy that strikes the crystal or ingot 203 during growth. Heat shield 205 is a planar section of silicon carbide, graphite, or other high temperature material supportably mounted on the walls of the growth chamber 202 having an interior opening sized to accommodate the silicon ingot 203. An annular region 211 adjacent the opening is deflected downward toward the melt to decrease heat flow along the ingot 203 and for minimizing thermal shock when the ingot is removed from the melt 222.

Figure 3A:
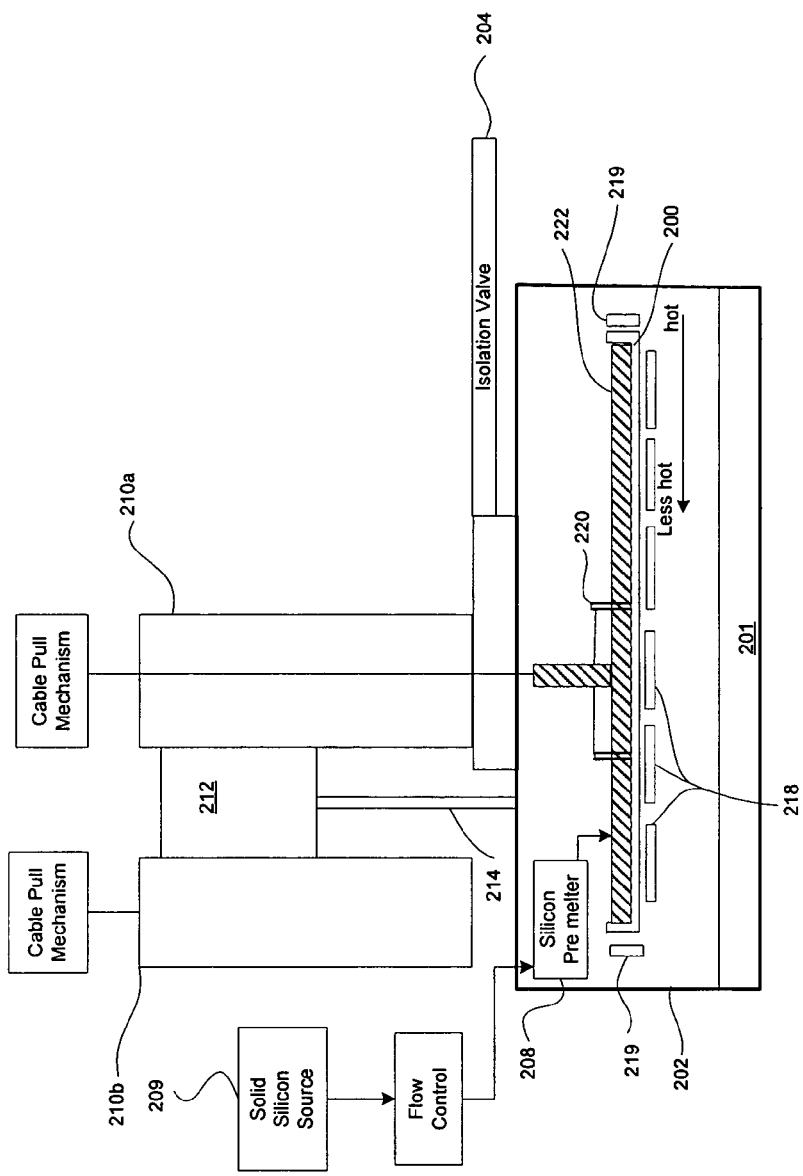
FIG. 3A is a schematic side view of a crystal growing system showing a pre-melter and individually controlled heating elements in accordance with an aspect of the present invention.

Referring to FIG. 3A, an optional weir 220 is disposed in the melt 222 between the crystal/melt interface and outlet port 228 of silicon pre-melter 208. The weir 220 rests on bottom of the crucible 200 or alternatively can be supported by support means such as any convenient supporting structure comprised of an inert material provided on the inner walls of the crucible. The top of the weir 220 extends above the surface of the melt 222. The purpose of the weir is to enable molten silicon from the pre-melter 208 to be distributed into the melt without the formation of ripples in the melt or thermal perturbations that would disturb the temperature distribution in the melt and adversely affect the growing silicon crystal 224. The weir 220 is characterized by low height in relation to its diameter and is generally cylindrical in shape with apertures provided in that portion of the weir extending beneath the surface of the melt to enable a desired thermal distribution in the melt.

The wide diameter, low aspect ratio growth crucible 200 also prevents or greatly reduces formation of convection currents in the melt and attendant scrubbing action upon the crucible, further reducing the introduction of oxygen. In a preferred embodiment, the low aspect ratio (diameter with respect to height) of the crucible is in a range of 4:1 to 10:1 and preferably about 8:1. In contrast, conventional crucibles have aspect ratios on the order of about 1:1-1:4.

Furthermore, annular heating elements are disposed in a radial pattern on or as close as possible to the base of the crucible, which was not possible in a conventional CZ grower due to the need for a lift mechanism. In addition to the heaters disposed around the circumference of the crucible, the annular heaters provide corresponding heating zones in the melt. This results in an optimal thermal distribution that is substantially horizontal through the melt. It also provides an optimal temperature distribution, particularly at the critical interface between the crystal and the melt. The improved temperature control provides accelerated crystal growth beyond what previously has been possible.

Melting of Granular Poly-Silicon in a Low Aspect Ratio Crucible

Conventional crucibles have high aspect ratios and lift mechanisms such that the level of the melt in the crucible, with respect to the heaters on the sides of the crucible, can be kept constant during crystal growth. Typically there are no heaters under the base of the crucible.

When such crucibles are charged with poly-silicon material the temperature distribution during the melt down process is highly non-uniform. The temperature is highest closest to the walls of the crucible where it is closest to the heaters and also cooler at the top and bottom of the melting material than at the center. The problem is greatly exacerbated when the poly-silicon material is in granular form with small particles (<1 mm diameter), large surface area and minimal points of contact between the granules, air being an excellent insulator. Heat flow between the granules tends to fuse them together at their points of contact. Additional heat flow is by radiation, very little is by convection at this stage. The granules closest to the heaters melt first and those at the edges and center slump down to the bottom of the crucible leaving a bridge of fused granules across the top surface and an air void beneath the bridge. Liquid silicon of course occupies much less volume than the granules. The combined effect is to retard the melting process and care must be taken not to drive melt temperatures close to the heaters to excess levels or contamination levels will increase. There are techniques to lessen the problem, but they are exacting and time consuming e.g. raising the crucible un stages up through the heaters such that the top of the mass of granules melts first, again being careful not to drive too much heat from the sides.

Figure 3B:
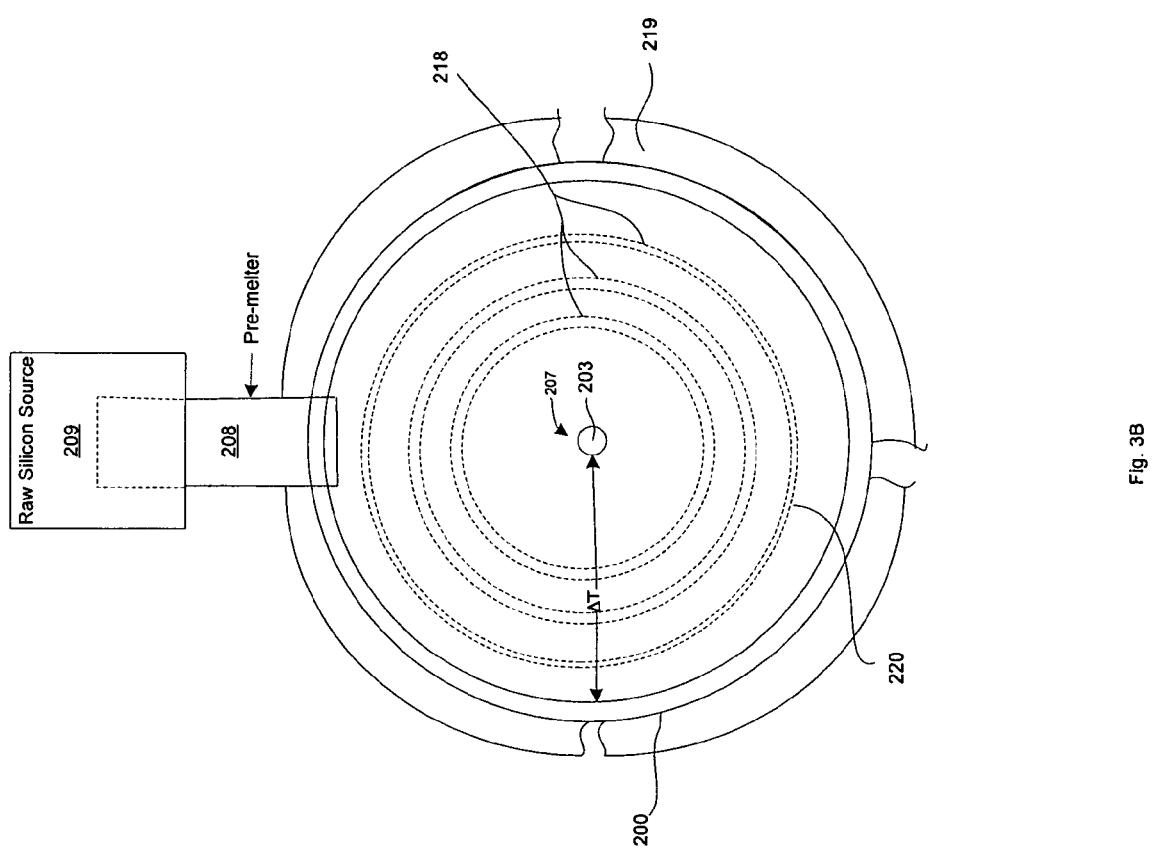
FIG. 3B is simplified top view of the crystal growing system as shown in FIG. 3A in accordance with an aspect of the present invention.

Referring to FIG. 3B, according to an aspect of the invention, a low aspect ratio crucible 200, has a plurality of annular heaters 218 disposed in a radial pattern beneath its base in addition to side heaters 219, to provide a much more uniform temperature distribution because of a) the lower depth of granules in the crucible and b) annular base heaters 218 applying heat in a more controlled distribution across the entire base surface area of the crucible. The annular base heaters 218 are preferably planar resistive heating elements that are individually controlled as described with respect to FIG. 5. Each heating element 218 generates a corresponding heating zone in the melt to provide an optimal temperature distribution through the melt. The higher surface area of contact between the granules and the heated walls of the low aspect ratio crucible, compared to the high aspect ratio crucible, drives more heat into the granules. Thus, the entire mass of granules melts much more uniformly and at a much more rapid rate without the attendant contamination associated with excess temperatures close to the heaters.

Figure 3C:
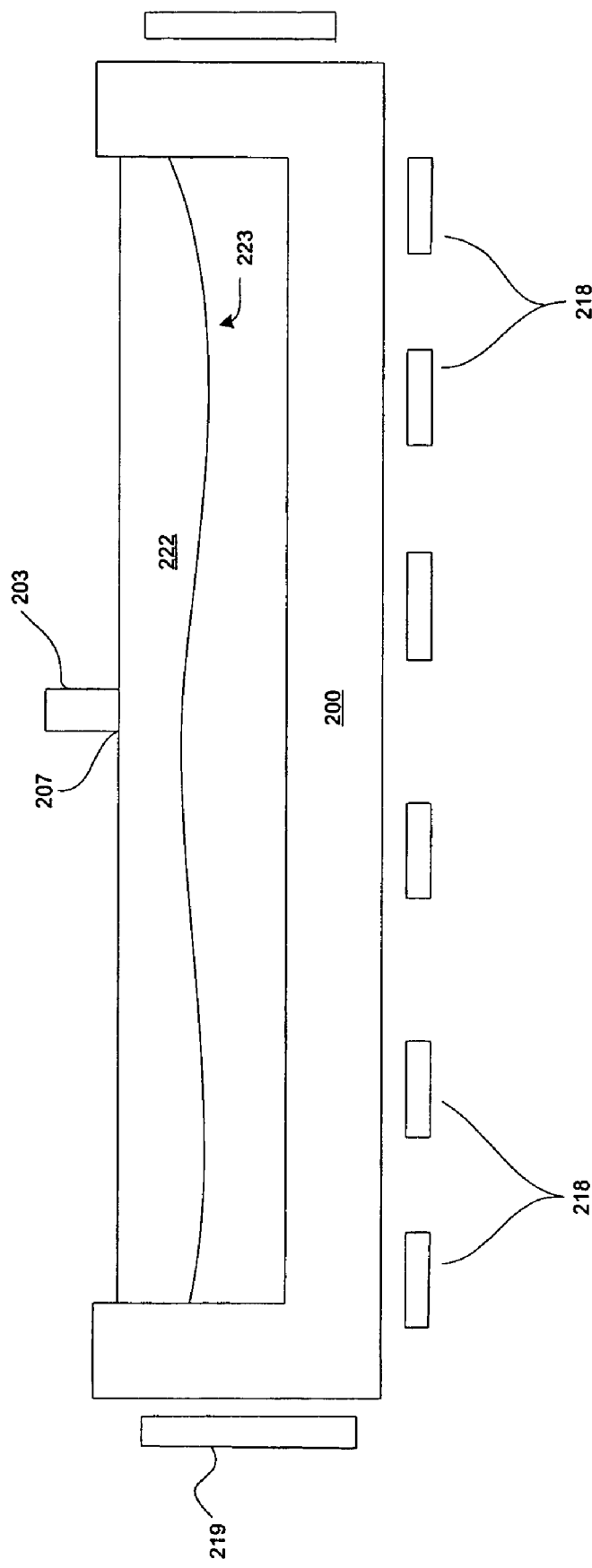
FIG. 3C is a schematic side view of the wide diameter, low aspect ratio crucible showing improved thermal gradient through the melt in accordance with an aspect of the present invention.

Referring to FIG. 3C, a low aspect ratio crucible 200 with annular base heaters 218 develops a thermal gradient 223 characterized by a substantially horizontal distribution through melt 222. In a continuous process using a low aspect ratio crucible, compared to a batch process, it is easier to transfer the heat to melt the initial charge because of: a) a smaller amount of poly-silicon "charge" melted at start-up and b) the pre-melter 208 providing liquid silicon to wet the granules provides larger areas of thermal contact between granules and accelerating the melting process. Note: the pre-melter also is designed to provide uniform heating around the granules rather than heating from one side to further enhance the melting process.

Pre Melter

Figure 4:
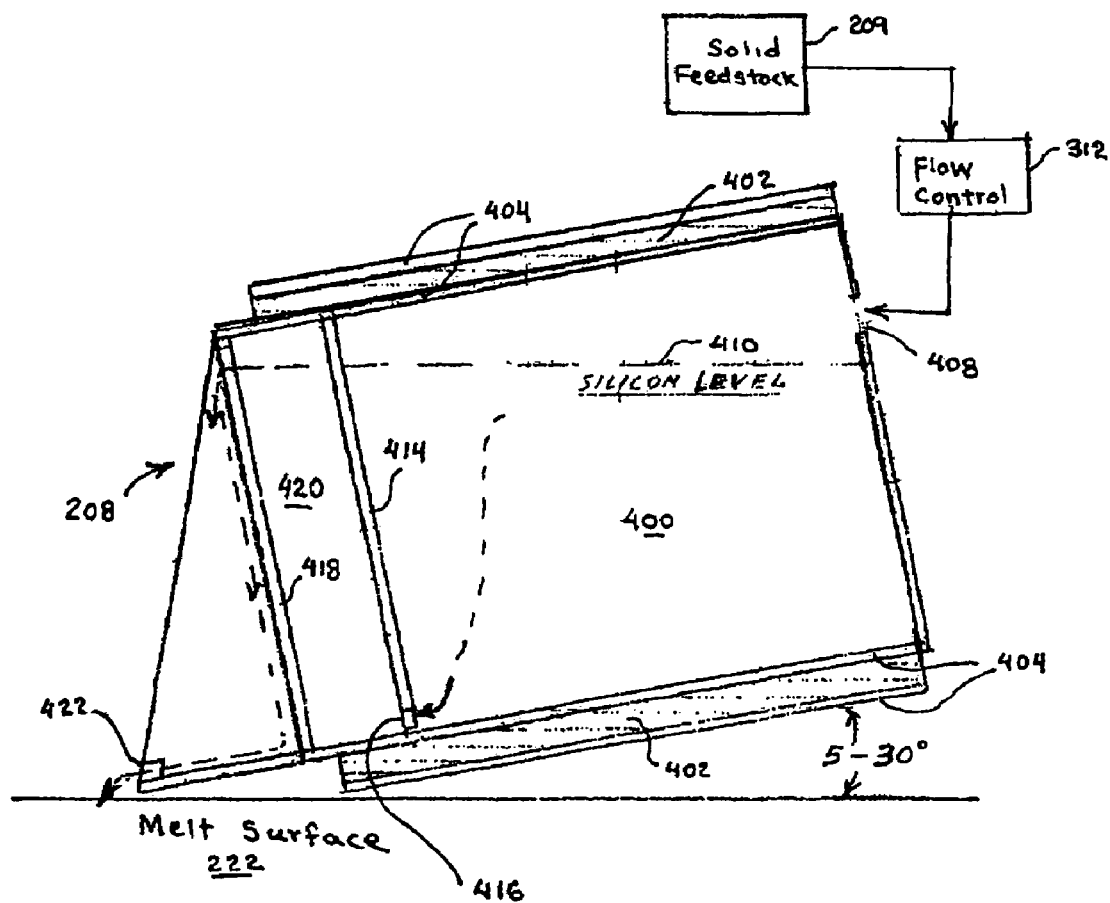
FIG. 4 is a side view of a pre melter for a crystal growing system in accordance with an aspect of the present invention.
Figure 5:
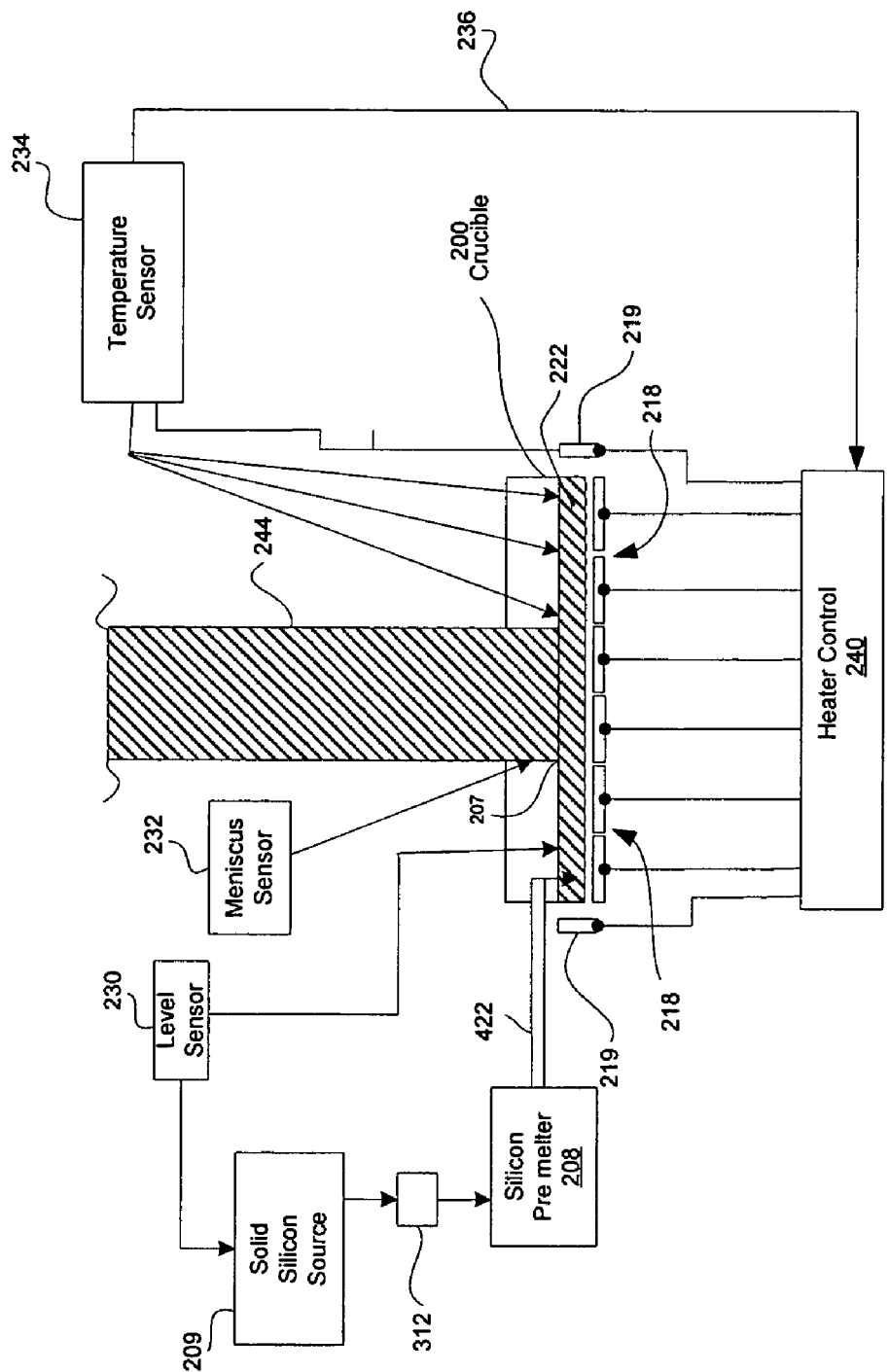
FIG. 5 is a schematic diagram showing a system for heater control to establish an optimized thermal distribution across the crucible in accordance with an aspect of the present invention.

Referring to FIGS. 3A, 4 and 5, the pre-melter 208 comprises a separate containment vessel for melting a quantity of solid feedstock material and for providing a constant source of molten material to growth crucible 200 for growing crystals. In the case of single crystal silicon, a source 209 of solid silicon feedstock such as silicon chips, chunks, granules or rods is provided through flow control device 212 to the pre melter 208 at a rate sufficient to replenish the growth crucible.

Figure 6:
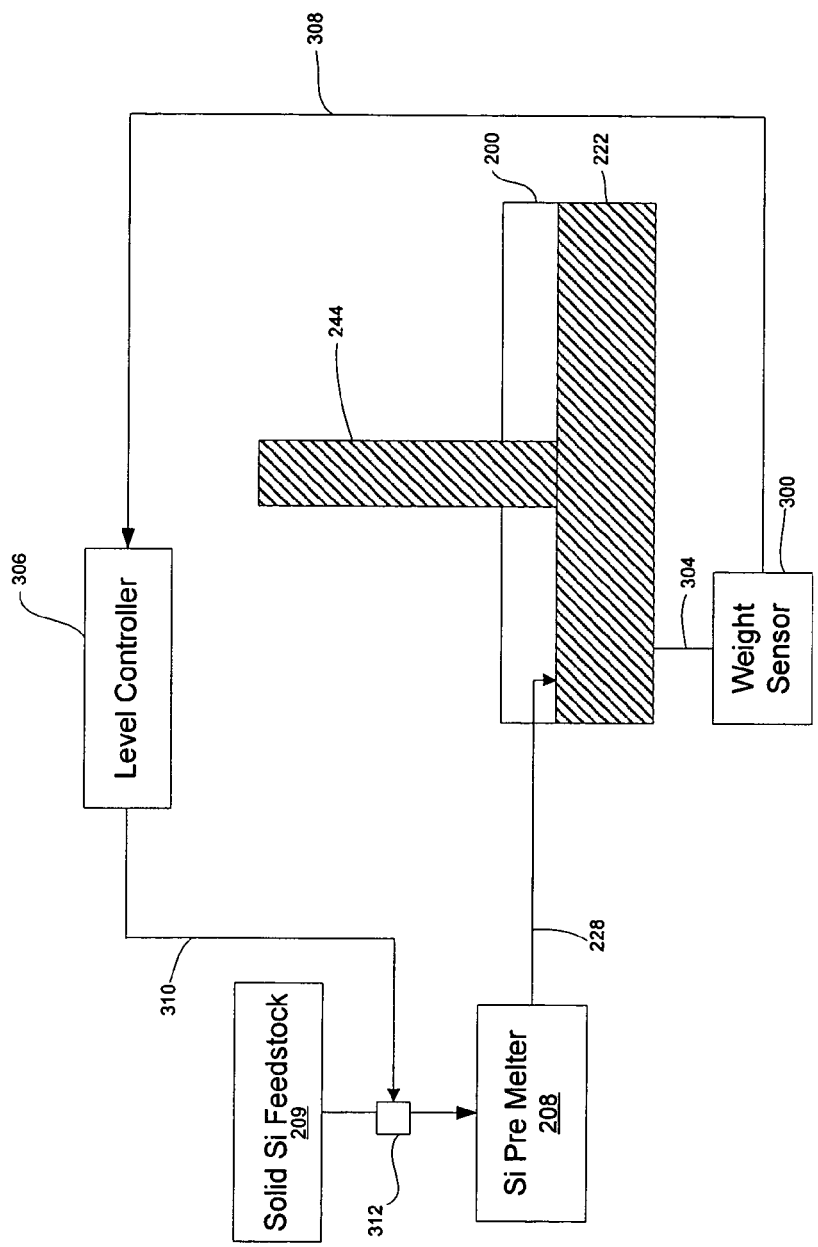
FIG. 6 is a schematic diagram showing a system for level control in the crucible accordance with an aspect of the present invention.

The pre melter can be separately situated apart from the growth chamber as shown in FIGS. 5 and 6. In a preferred embodiment, the pre melter 208 comprises a separate containment means provided within the growth chamber 202 for melting a quantity of feedstock and providing it to the surface of the melt 222. This advantageously places the pre melter 208 in the controlled atmosphere of the growth crucible 222 and minimizes the distance that the melt from the pre-melter needs to travel needs to travel to reach the crucible.

Referring to FIG. 4, the pre melter comprises a melting chamber 400 with heaters 402 suitably disposed around the chamber for melting and containing a quantity of solid feedstock. A layer of insulation 404 is disposed between the heaters 402 and melting chamber 400. A layer of insulation 404 is also provided around the exterior surface of the heaters 402. In a preferred embodiment the pre melter 208 is inclined in a range of from 5-30 degrees with respect to the surface of the melt 222 in the crucible to facilitate flow into the melt An inlet 408 is provided for receiving solid silicon feedstock at or above silicon level 410. A first weir 414 defines a separate first section or portion of the melting chamber for receiving and melting the solid feedstock. Inlet 408 also provides a means for receiving a predetermined quantity of solid dopant material. As a non-limiting example, dopant material can be a dice of heavily doped wafer on the order of 0.125× 0.125×0.25 inches at a rate of up to 10 dices per ingot. Subsequent ingots in an ingot stream will require less dice.

The amount of dopant dice required is a function of the amount of dopant taken up in the crystal, as it is grown. That is, the dice simply top up that dopant which is taken up from the melt into the crystal. Adding dopant in the pre melter avoids thermal perturbations and non-uniform temperature distribution that otherwise would result from adding solid chunks of dopant into the melt. Such temperature distribution problems would arise from the latent heat of fusion and thermal capacity to bring the dopant material up to melt temperature. Note that such thermal perturbation problems are much the same as when adding solid silicon feedstock directly into the melt, although very much reduced. Due to the optimized thermal gradient across the melt and the control of thermal zones in the melt by respective individually controlled heating elements, a uniform thermal distribution can be maintained across the radius of the growing crystal. Thus, the addition of dopant material at inlet 408 can provide substantially uniform resistivity or conductivity axially (longitudinally) and radially in the finished ingot.

First weir 414 is provided with an outlet 416 at the bottom of the first section to ensure that unmelted, solid material, floating in molten silicon by virtue of its density lower than molten silicon, does not pass directly through to the crucible 200. A second weir 418 controls the level in the pre-melter. Second weir 418 also defines a second section or portion of the pre-melter. Silicon enters the second portion 420 of pre melter 208 at the bottom through outlet 416. It then rises to the level 410 in the first section. Note, that due to the fact that solid granules or unmelted pieces of silicon float, it is critical to provide a two weir system in the pre melter to ensure that molten silicon circulates to the bottom of the pre melter by means of the outlet 416 in the first weir and then fills the section 420 defined by second weir 418 from the bottom. The molten silicon that enters the crucible melt from the second weir 418 at outlet 422 is thus taken from the bottom of the pre melter. This arrangement advantageously prevents solid particles of silicon from entering the growth crucible.

In this manner pre-melter 208 provides a constant source of molten silicon to growth crucible 200, replenishing the silicon that is being taken up by the growing crystal. This enables the melt in growth crucible 200 to be maintained at a constant level with respect to a crystal, without the need for vertical travel of the crucible and also enables the level of the melt in the crucible to be increased or decreased as required. This advantageously eliminates the complex mechanisms in a conventional CZ system necessary for coordinating vertical travel of the crucible with the pulling of the crystal. Such replenishment by the pre melter also enables heaters to be positioned on the base of the crucible. This aspect of the invention greatly simplifies the apparatus needed for growing single crystal silicon and ultimately enables accelerated production of single crystal silicon at lower cost.

The continuous addition of melted silicon by the use of pre melter 208 eliminates the lost time involved and energy wasted in shutting the furnace or heating elements off to recharge the crucible 200 and remelt the silicon. The use of a substantially continuous source of molten silicon feedstock to replenish the melt minimizes the time the melt is in contact with the crucible, thus further limiting oxygen absorption into the melt. Since the raw silicon is melted within the pre-melter in very small quantities and immediately flows into the growth crucible, dwell time and surface area of contact are likewise minimized. Furthermore, there is no need to open the growth chamber to ambient atmosphere in order to replace the crucible and provide a new silicon charge, a process introducing new contamination into the growth chamber.

Another advantage of silicon pre-melter 208 is that the axial resistance of the crystal can be better controlled as dopant can be added during recharging. This advantageously eliminates the axial resistivity gradient exhibited in crystals grown by the conventional CZ process. The effects of segregation in the melt and resulting non-uniform dopant profiles in the crystal are substantially eliminated. Yet another advantage of using a separate silicon pre-melter 208 communicating with growth crucible 200 is that eliminating the high temperature initial melting of a silicon charge minimizes the stress on the growth crucible and lowers the precipitation of oxygen into the melt.

It will be appreciated that the pre-melter can be made from, or coated with, an inert material such as sintered silicon carbide or like ceramic, or with other materials characterized by an inert character with respect to molten silicon such as tantalum, niobium, or oxides and compounds thereof, to reduce oxygen and other impurities in the melt, as is the case for the crucible.

The silicon pre-melter 208 in combination with the low aspect ratio, non-reactive, sintered silicon carbide crucible 200 and controllable dopant feed during crystal growth substantially eliminates segregation, high impurity levels and oxygen precipitation that cause defect structures and sites of minority carrier recombination. This aspect of the invention is especially useful in providing higher minority carrier lifetime silicon for high conversion efficiency solar cells.

Multiple Crystal Pulling Chambers

Referring again to FIGS. 2 and 3A, multiple pull chambers 210a, 210b are provided on a rotating cylinder 212 that is in turn supported by a spindle 214. It will be appreciated that multiple pull chambers 210a, 210b also can be arranged in a moveable, linear supporting member for consecutive positioning of a seed crystal in each successive pulling chamber into the growth zone in crucible 200 within growth chamber 202. Multiple pull chambers 210a, 210b thus are rotatably or sequentially disposed with respect to the growth chamber 202. Upon completion of a first single crystal silicon ingot, the first pulling chamber 210a moves the finished silicon ingot out of the growing zone in crucible 200 and out of growth chamber 202 for cooling, and a successive pulling chamber 210b moves to position a new crystal into growth chamber 202 and to the growing zone at a crystal/melt interface in crucible 200. The isolation valve 206 closes to control the atmosphere in growth chamber 202 and the associated pull chamber, and a new crystal is grown.

The sequential positioning of pulling chambers 210a, 210b at the growing zone in crucible 200, is the final step in the continuous process, minimizing dwell time of silicon in the growth crucible, eliminating down time associated with cooling each crystal, changing to a new crucible, recharging the crucible, evacuating the growth chamber and reheating the charge to melt temperature; thus providing an accelerated, continuous crystal growth system with high throughput. Also, such a continuous process eliminates the single use nature of the growth crucible and enables the growth crucible to be used for multiple (10 or more) crystal growing cycles Composition of Crucible Referring again to FIGS. 2, 3A, 3B and 3C, another aspect of the invention provides a low aspect ratio, wide diameter crucible 200 comprised of a material that is inert to molten silicon such as alpha or beta sintered silicon carbide, tantalum nitride, or similar ceramic that contains no silica. Alternatively, the interior silicon containing surface of the crucible 200 may be provided with a coating of such an inert material in accordance with techniques that are well known. Such a desirable inert material is comprised of a mixture of silicon carbide grains and a sintering aid that is pressed and sintered. Unlike reaction-bonded carbide, there is no free silicon present. Such direct sintered materials have no metal phase and are therefore resistant to chemical attack. Alpha silicon carbide refers to a hexagonal structure and beta to a cubic structure.

Such sintered silicon carbide materials are available from CARBORUNDUM Corp., designated SA-80; from GENERAL ELECTRIC, designated as Sintride, and from KYOCERA, designated as SC-201.

A chemically inert growth crucible 200 comprised of the foregoing sintered silicon carbide materials is unknown in a conventional CZ growing process, because the conventional crucible is a single use, disposable item, and there is no motivation to provide a sintered silicon carbide or ceramic crucible or such a coating on the crucible surface.

A conventional CZ growing process does not contemplate the use of a crucible material, such as sintered silicon carbide, to substantially eliminate the introduction of oxygen into the melt. In a conventional CZ system, a growth crucible is typically discarded after one or two growth cycles. Thus, a coating of silicon carbide or a crucible made from a higher cost material would add significantly to the cost of a conventional CZ system. It will be appreciated that these materials can also be used advantageously in the pre-melter for similar reasons.

Further, oxygen precipitates originating from the growth crucible walls previously were not recognized as a serious problem and even could be beneficial in integrated circuit and other electronic devices. Oxygen precipitates form sites on which other impurities tend to accumulate. Such oxygen precipitates can be positioned in a predetermined manner remotely from an active device region in a finished IC wafer. Oxygen precipitates then function as gettering sites that attract unwanted impurities away from electrically active regions, thereby improving device performance.

However, in accordance with an aspect of the invention, oxygen precipitates and associated defects are recognized as a problem for minority charge carrier lifetime in silicon that is to be used for specialized applications such as solar cells. In a solar cell, if some of the generated carriers in a photovoltaic cell recombine at defects, impurities, or sites of oxygen precipitates in the silicon, before reaching the electrical contacts, output current is diminished. Across multiple solar cells, such defects can seriously decrease output current.

Heater and Melt Temperature Control

FIGS. 3B, 3C and 5 show a heater and melt temperature control system that provides closed loop control of temperature characterized by optimal temperature distribution across the melt and uniform optimal thermal conditions in the solidification zone at the melt/crystal interface 207 aiding in controlling crystal formation rates and further minimizing defect density.

Referring to FIGS. 3B and 5, a plurality of annular resistive heating elements 218 are disposed in a radial pattern beneath the low aspect ratio crucible 200. Additional resistive heating elements 219 are disposed around the circumference of the outer wall of crucible 200. Annular heating elements 218 and side wall heating elements 219 are individually controlled by heater control 240 to generate separate heating zones for providing an optimal temperature distribution across the melt. Heater control 240 includes a microprocessor controller for controlling the activation time and consequently thermal output of each heater element in response to signals from the sensors 234.

Thus, a series of thermal zones representative of an optimal thermal distribution are established across the melt. Each thermal zone corresponds to the thermal output of a separately controlled resistive heater element 218. A temperature sensor 234 comprising one or more optical pyrometers takes a temperature reading of each separate thermal zone across the melt, each zone controlled by a corresponding heater element. A single pyrometer also may scan separate zones, providing an output signal on lead 236 representative of the temperature of each zone. The temperature sensor 234 also may include a thermocouple for sensing temperature of the outer heating elements 219 disposed around the circumference of the crucible 200.

In accordance with standard closed loop load regulation techniques, the temperature sensor 234 sends a signal on line 236 representative of the temperature of each respective thermal zone to heater control unit 240. Heater control unit 240 sends a corresponding activation signal to each heating element to maintain that heating element in a predetermined range. After achieving the desired control set point, heater and melt temperature can be maintained in a narrow range. It will be appreciated that individual control of resistive heating elements 218 provides an optimized thermal distribution between the walls of the crucible and the crystal. The rate of pull (rate of growth of the crystal) is controlled by the temperature distribution at the interface between the crystal and the melt. Accordingly, this aspect of the invention provides an optimized temperature distribution to be maintained substantially horizontally across the melt and particularly at the crystal melt interface with greater control than was previously possible. It will be appreciated that this optimized temperature distribution is achieved by the unique design of the wide aspect ratio crucible in combination with the individually controlled heating elements placed beneath and around the crucible coupled with the lower depth of melt.

Referring again to FIG. 4, since introduction of solid silicon feedstock into the melt can cause temperature perturbations, improved control of the melt is achieved by silicon pre-melter 208 wherein the predominance of all melting of silicon is done outside the crucible. A source of solid silicon feedstock 209 comprises silicon feedstock in a variety of forms such as crushed silicon, chips, chunks, granules from a fluidized bed, silicon rods, or the like.

As shown in FIG. 5, the rate of addition of solid silicon from source 209 to pre-melter 208 may be controlled by melt level sensor 230. Silicon pre-melter 208 is provided with an outlet 422 that discharges molten silicon into the melt 222 and behind the optional weir 220 (FIG. 3B) without introducing perturbation in the melt. Melt level sensor 230 provides improved closed loop control over molten silicon released into the melt. Level sensor 230 comprises, for example, a 5 mW, 670 nm visible, Class IIIa laser and photo detector system. A meniscus sensor 232 is used to monitor the diameter of the crystal as it grows in conventional optical pattern recognition techniques. Crystal growth takes place at the meniscus interface 207 between the crystal 244 and the melt 222 and the pull rate is adjusted to give the desired ingot diameter In accordance with an aspect of the invention, a meniscus sensor 232 comprising a laser and photo detector system as previously described is aimed at the meniscus interface between the crystal 244 and melt 222. The meniscus sensor 232 continuously monitors the position and size of the meniscus interface and provides corresponding output signals to the level sensor. In like manner, the level sensor carefully monitors the melt level. In this way, a predetermined crystal growth rate and diameter can be closely controlled with active feedback. If more molten silicon is needed to achieve a predetermined crystal size, the level sensor provides output signals to the silicon source control 209 to additional solid silicon to the pre-melter. The pre-melter 208 in turn releases molten silicon into the melt.

Level Control

Referring to FIG. 6, in a preferred embodiment, improved level control of the melt 222 in the growth crucible 200 and the rate of discharge of molten silicon feedstock from pre-melter 208 into the melt 222 is achieved by an active feedback system for sensing the weight of the silicon melt in the growth crucible and adjusting the amount of silicon feedstock provided to the pre melter, and the amount or rate of molten silicon discharged from the pre melter 208 into the melt.

A sensitive means for determining the weight of the growth crucible both empty and with a desired level of melt is provided by a weight sensor 300. A suitable weight sensor 300 comprises one or more strain gauge based load cells. Each load cell is a transducer that converts a load or weight acting on it into an electrical signal representative of that load. The weight of silicon melt in the crucible 200 produces a deflection of a mechanical beam or arm 304 that is in contact with the crucible 200. This in turn produces an electrical resistance change proportional to the load. The load cell or weight sensor 300 then produces an output signal representative of the weight of the melt 222 to microprocessor based level controller 306 over a communication link 308. The communication link 308 can be can be an electrical cable or a fiber optic, infra red or wireless link to provide stable high temperature operation.

In response to signals from weight sensor 300, level controller 306 produces output signals over a communication link 310 to actuate a dispenser or flow controller 312 that controls the release of a predetermined amount of solid silicon feedstock 209 into the pre melter 208. Level controller 306 comprises a microprocessor for determining output of the pre melter based on a desired depth D of melt in the growth crucible. According to an aspect of the invention, this is determined by the following relationship:

$$D=(W-Wt)/(\pi R^2 \rho)$$

where W is the total weight of the crucible 200 containing melt 222; Wt is the weight of the crucible 200 measured empty; R is the internal diameter of the crucible; and $\rho$ is the density of liquid silicon.

In this manner, it is possible to control the level of the silicon in the pre melter and the level of the melt 222.

It will be appreciated that the foregoing system provides an optimal output capacity of the pre melter and enables a closely controlled, optimized replenishment of the pre melter and growth crucible. This advantageously accelerates throughput by allowing crystal growth to be run with a much lower charge of melt than in a conventional CZ process and contributes to the reduced dwell time of the silicon in the crucible and attendant reduction in impurities. This further enables a new crystal to be started more quickly after emptying the crucible through a combination of crystal growth and truncating flow from the pre melter.

The foregoing features of the present invention provide a single crystal silicon growth process that minimizes the precipitation of oxygen into the melt and minimizes or eliminates impurities and segregation in the melt. Because those factors minimize impurity levels and defect structures that give rise to carrier recombination sites, the process of the invention directly achieves enhanced minority carrier lifetime in silicon. Such silicon with enhanced minority carrier lifetime also can be achieved at higher growth rates and lower cost than were previously possible, due to the simplified crystal growing apparatus. The silicon produced by the process according to this invention has a particular advantage in providing more efficient, low-cost high lifetime solar cells.

Scope

While the invention has been described in connection with what are presently considered to be the most practical and preferred embodiments, it is to be understood that the invention is not limited to the disclosed embodiments and alternatives as set forth above, but on the contrary is intended to cover various modifications and equivalent arrangements included within the scope of the forthcoming claims. For example, other materials that are amenable to being grown by the CZ process may be employed as the melt material, such as gallium arsenide, gallium phosphide, sapphire, and various metals, oxides and nitrides.

Also, other materials that are resistant to breakdown by molten silicon, such as ceramic coatings, or various metals, oxides, nitrides, and combinations thereof can be used for the composition of the crucible, or as a coating on interior walls of the crucible.

Separate weirs or baffles can be provided to protect the crystal from convection currents and thermal perturbations. Multiple pulling chambers can be provided for continuous pulling of successive crystals without necessarily being rotated in place over the crucible. What is important is that a succession of crystal pulling chambers are sequentially positioned over the crucible for repeated, substantially continuous crystal growth without the need to remove the crucible after each growth cycle. Therefore, persons of ordinary skill in this field are to understand that all such equivalent arrangements and modifications are to be included within the scope of the following claims.

I claim:

1. An improved CZ system for growing a single crystal ingot from a molten crystalline material comprising:
    a fixed low aspect ratio, wide diameter crucible including a base and side walls for holding a quantity of molten material at a melt/crystal interface with respect to a seed crystal for growing an ingot from the molten material;
    a pre melter for providing a substantially continuous source of molten material to the crucible, such that the melt/crystal interface is maintained at a desired level without vertical travel of the crucible;
    annular heating means comprising separately controllable heater elements provided adjacent the base of the crucible at a fixed distance therefrom, each heating element for transferring a desired amount of thermal energy to an adjacent portion of the crucible for providing a controllable thermal distribution across the crucible and at the crystal/melt interface for optimal crystal growth.

2. An improved CZ system as in claim 1 wherein the annular heating means comprise a plurality of separately controlled resistive heaters disposed in a radial pattern to establish corresponding thermal zones, each thermal zone controlled by thermal output of a respective resistive heater such that an optimal thermal distribution is established the crucible.

3. An improved CZ system as in claim 2, further comprising one or more individually controlled side wall heaters and one or more sensors for monitoring temperature of each thermal zone and for producing signals representative of sensed temperature;
    control means responsive to the sensor signals for activating each side wall heater and annular heating means such that an optimal thermal distribution is established across the melt and at the crystal/melt interface.

4. An improved CZ system as in claim 1 comprising means for adding dopant as needed to the pre melter during crystal growth to provide compensation for segregation and establish a substantially uniform dopant concentration in the grown crystal.

5. An improved CZ grower as in claim 1 further comprising a plurality of crystal pull chambers sequentially disposed with respect to the crucible, each pull chamber including means for positioning a seed crystal at the melt/crystal interface and for pulling the growing ingot, such that upon completion of growth of a first ingot, a first pull chamber moves the first ingot away from the crucible for cooling, and a successive pull chamber moves to position a new crystal at the crystal/melt interface in the crucible.

6. An improved CZ system according to claim 1 wherein the low aspect ratio (diameter with respect to height) of the crucible is in a range of 4:1 to 10:1 and preferably about 8:1.

7. A system for continuous growth of a single crystal ingot as in claim 1 further comprising a means for adding amounts of dopant material to the pre melter, such that dopant concentration throughout the ingot is substantially uniform.

8. A system for continuous growth of a single crystal ingot comprising:
    a low aspect ratio, large diameter crucible including a base for holding a melt of crystalline material;
    a pre-melter having an inlet for receiving a supply of crystalline material, a means for melting the material, and an outlet communicating with the crucible for replenishing the melt as it is taken up by the growing crystal, such that the melt in the crucible is maintained at a desired level with respect to the crystal, without vertical travel of the crucible;
    multiple crystal pull chambers sequentially disposed with respect to the crucible such that upon growth of a first ingot, a first pull chamber moves the first ingot out of the crucible for cooling, and a successive pull chamber moves to position a new crystal in the crucible;
    individually controllable heating means disposed adjacent to the base of the crucible for providing an optimal thermal distribution across the melt and at the crystal/melt interface for improved crystal growth.

9. A system for continuous growth of a single crystal ingot as in claim 8 further comprising a means for adding precise amounts of dopant material as needed to the pre melter such that an axial, (lengthwise), electrical conductivity of the ingot is substantially uniform.

10. A system for continuous growth of a single crystal ingot as in claim 8 further comprising a weir disposed in the melt between the crystal/melt interface and outlet port of the pre melter; the weir including a top surface extending above the melt to block formation of ripples or thermal perturbations in the melt as molten material from the pre-melter is distributed into the melt.

11. An improved CZ system for growing a single crystal ingot from a molten crystalline material comprising:
    a fixed low aspect ratio, wide diameter crucible for holding a quantity of molten material at a melt/crystal interface with respect to a seed crystal for growing an ingot from the molten material without vertical travel of the crucible;
    a pre melter for receiving a source of solid crystalline material and dopant material and providing a continuous source of molten doped material to the crucible;
    individually controllable heating means disposed around the sides and adjacent to the base of the crucible at a fixed distance therefrom for providing corresponding controllable heating zones across the crucible and at the crystal/melt interface for improved crystal growth.

12. An improved CZ system for growing an ingot from a seed crystal positioned at a growth interface in a crucible including a pre melter for melting solid crystalline feedstock received from a source and for providing an output of molten material to the crucible, comprising;
    a load cell means mechanically coupled with the crucible for sensing the weight of the melt in the crucible and for producing output signals representative of the sensed weight;
    a level controller comprising a microprocessor responsive to signals from the load cell and for determining output of the pre melter based on a desired depth D of melt in the growth crucible;
    a flow control means, communicatively linked with the level controller and disposed between the source of solid feedstock and the pre melter for truncating or dispensing feedstock from the source to the pre melter in response to a signal from the level controller such that the output of the pre melter maintains the level of melt in the crucible at a predetermined depth for optimal crystal growth.

13. An improved CZ system as in claim 1 further comprising a weir disposed around the crystal melt interface such that the pre melter provides the continuous source of molten material to the crucible without perturbation of the melt and the crystal/melt interface.

14. An improved CZ system as in claim 1 or 7 further comprising:
a low aspect ratio, wide diameter crucible having interior surfaces for containing the molten material coated with a material selected from the group consisting of: alpha or beta sintered silicon carbide, tantalum nitride, or similar ceramic.

15. An improved CZ system as in claim 1 or 7 further comprising:
a low aspect ratio, wide diameter crucible comprising a material selected from the group consisting of: alpha or beta sintered silicon carbide, tantalum nitride, or similar ceramic.

16. An apparatus for substantially uniform melting of crystalline feedstock including solid granules characterized by a diameter on the order of 1 mm or less in a crucible comprising:
a fixed low aspect ratio, wide diameter crucible for holding the molten crystalline feedstock without vertical travel;
a plurality of independently controllable heaters provided beneath the base of the crucible at a fixed distance therefrom, such that a maximized surface area of contact and minimized thermal path exists between the granules and the independently controllable heaters beneath the low aspect ratio crucible; and
means for applying power to thermally activate each heater to achieve an optimal temperature distribution such that the thermal zones drive heat uniformly into the granules at a desired rate.

17. An apparatus according to claim 16 further comprising:
control means for monitoring power consumption of each heater needed to achieve the optimal temperature distribution and for applying power to thermally activate each heater in accordance with the monitored power consumption to achieve a repeatable state wherein granules melt uniformly at a desired rate.

18. An apparatus according to claim 16 wherein the low aspect ratio, diameter with respect to height, of the crucible is in a range of 4:1 to 10:1 and preferably about 8:1.

19. An apparatus for substantially uniform melting of silicon or polysilicon crystalline material including solid granules down to a diameter on the order of 1 mm or less in a crucible comprising:
a fixed, low aspect ratio, wide diameter crucible for holding the silicon or polysilicon melt without vertical travel;
a plurality of independently controllable heaters disposed beneath the crucible at a fixed distance therefrom for establishing corresponding thermal zones through the melt, such that a maximized surface area of contact and minimized thermal path exists between granules in the melt and the independently controllable heaters beneath the low aspect ratio crucible;
means for thermally activating each heater to achieve an optimal thermal distribution across the melt such that granules are melted uniformly at a desired rate; and
control means for selectively controlling thermal activation of each heater by monitoring power consumed by each heater to achieve the optimal thermal distribution across the melt.

20. An apparatus according to claim 18 wherein the low aspect ratio (diameter with respect to height) of the crucible is in a range of 4:1 to 10:1; and most preferably in a range of about 8:1.

21. An improved CZ system for growing one or more single crystal silicon ingots from a molten silicon material comprising:
a fixed low aspect ratio, wide diameter crucible including a base and side walls for holding a quantity of molten silicon at a melt/crystal interface with respect to a seed crystal for growing the ingot from the molten material;
a pre melter for providing a continuous source of molten silicon feedstock to the crucible, such that the melt/crystal interface is maintained at a desired level without vertical travel of the crucible;
a plurality of growth chambers rotatably disposed with respect to the crucible for pulling the seed crystal to form an ingot, such that the same crucible is recharged by the pre melter for each growth chamber;
annular heating means disposed beneath the base of the crucible at a fixed distance therefrom for providing a uniform thermal distribution across the crucible and at the crystal/melt interface for optimal crystal growth.

22. An improved CZ system as in claim 21 wherein the annular heating means comprise a plurality of separately controlled resistive heaters disposed in a radial pattern to establish corresponding thermal zones across crucible, each thermal zone controlled by thermal output of a respective resistive heater such that an optimal thermal distribution is established across the crucible and at the crystal/melt interface.

23. An improved CZ system as in claim 21 wherein the fixed distance from the crucible is in a range of ¼ inch to about 12 inches and preferably from ¼ inch to about 3 inches.

* * * * *